(12) United States Patent
Chen et al.

(10) Patent No.: US 8,952,267 B2
(45) Date of Patent: Feb. 10, 2015

(54) ELECTRIC CONNECTING STRUCTURE COMPRISING PREFERRED ORIENTED $CU_6SN_5$ GRAINS AND METHOD FOR FABRICATING THE SAME

(71) Applicant: National Chiao Tung University, Hsinchu (TW)

(72) Inventors: Chih Chen, Hsinchu (TW); Han-Wen Lin, Chiayi (TW)

(73) Assignee: National Chiao Tung University, Hsinchu (TW)

( * ) Notice: Subject to any disclaimer, the term of this patent is extended or adjusted under 35 U.S.C. 154(b) by 119 days.

(21) Appl. No.: 13/829,256

(22) Filed: Mar. 14, 2013

(65) Prior Publication Data
US 2013/0302646 A1 Nov. 14, 2013

(30) Foreign Application Priority Data
May 10, 2012 (TW) .............................. 101116641 A

(51) Int. Cl.
*H05K 1/09* (2006.01)
*H05K 3/40* (2006.01)
(Continued)

(52) U.S. Cl.
CPC ................ *H01R 13/03* (2013.01); *H01R 43/02* (2013.01); *H01L 24/11* (2013.01); *H01L 21/4846* (2013.01); *H01L 24/03* (2013.01); *H01L 24/05* (2013.01); *H01L 24/16* (2013.01); *H01L 24/81* (2013.01); *B23K 1/0016* (2013.01); *H01L 24/13* (2013.01); *H01L 2224/03462* (2013.01);
(Continued)

(58) Field of Classification Search
CPC ..................... H01L 21/4846; H01L 23/49811; H01L 24/05; H01L 24/11; H01L 24/16; H01L 24/81; H05K 1/09; H05K 3/40
USPC .................................................. 174/250–264
See application file for complete search history.

(56) References Cited

U.S. PATENT DOCUMENTS

| 6,867,503 B2 | 3/2005 | Zeng |
| 2006/0267157 A1 | 11/2006 | Edwards et al. |
| 2008/0182124 A1 | 7/2008 | Gruber et al. |

FOREIGN PATENT DOCUMENTS

| TW | 515849 B | 1/2003 |
| TW | 583346 B | 4/2004 |

(Continued)

*Primary Examiner* — Timothy Thompson
*Assistant Examiner* — Paul McGee, III
(74) *Attorney, Agent, or Firm* — Muncy, Geissler, Olds & Lowe, P.C.

(57) ABSTRACT

An electric connecting structure comprising preferred oriented $Cu_6Sn_5$ grains and a method for fabricating the same are disclosed. The method of the present invention comprises steps: (A) providing a first substrate; (B) forming a first nano-twinned copper layer on part of a surface of the first substrate; (C) using a solder to connect the first substrate with a second substrate having a second electrical pad, in which the second electrical pad comprises a second nano-twinned copper layer, and the solder locates between the first nano-twinned copper layer and the second nano-twinned copper layer; and (D) reflowing at the temperature of 200° C. to 300° C. to transform at least part of the solder into an intermetallic compound (IMC) layer, in which the IMC layer comprises plural $Cu_6Sn_5$ grains with a preferred orientation; wherein at least 50% in volume of the first and second nano-twinned copper layer comprises plural grains.

24 Claims, 6 Drawing Sheets

(51) Int. Cl.
  *H01R 13/03*   (2006.01)
  *H01R 43/02*   (2006.01)
  *H01L 23/00*   (2006.01)
  *H01L 21/48*   (2006.01)
  *B23K 1/00*    (2006.01)

(52) U.S. Cl.
  CPC ............ *H01L2224/05541* (2013.01); *H01L 2224/05647* (2013.01); *H01L 2224/81191* (2013.01); *H01L 2224/81447* (2013.01); *H01L 2224/8181* (2013.01); *H01L 2224/81815* (2013.01); *H01L 2924/3651* (2013.01); *H01L 2224/16503* (2013.01); *H01L 2224/13111* (2013.01)
  USPC ..................................................... 174/262

(56) References Cited

FOREIGN PATENT DOCUMENTS

| TW | 200515572 A | 4/2004 |
| TW | 201133662 A | 10/2011 |

ELECTRIC CONNECTING STRUCTURE COMPRISING PREFERRED ORIENTED $Cu_6Sn_5$ GRAINS AND METHOD FOR FABRICATING THE SAME

CROSS REFERENCE TO RELATED APPLICATION

This application claims the benefits of the Taiwan Patent Application Serial Number 101116641, filed on May 10, 2012, the subject matter of which is incorporated herein by reference.

BACKGROUND OF THE INVENTION

1. Field of the Invention

The present invention relates to an electric connecting structure and a method for fabricating the same and, more particularly, to an electric connecting structure comprising preferred oriented $Cu_6Sn_5$ grains and a method for fabricating the same.

2. Description of Related Art

Copper (Cu) is generally used in metal connecting devices (for examples, metal interconnects, under bump metallizations (UBMs), Cu pillar, or through silicon via (TSV) because of its high electrical conductivity and thermal transferring ability.

For instance, when Cu is applied in the UBM of a packaging structure, UBM is frequently electrically connected to other electronic elements through soldering. The process for connecting UBM to other electronic elements requires high-temperature reflow process, and intermetallic compounds (IMCs) may be generated in the reaction between copper and solder.

As shown in FIG. 1, the conventional flip-chip solder joint structure comprises two chips 11, 12, wherein each chip 11, 12 respectively has electrical pads 13, 14 made of Cu, and the electrical pads 13, 14 electrically connect to each other through a solder 17. After a reflow process, Cu atoms contained in the electrical pads 13, 14 may diffuse into the solder 17 and react with tin (Sn) atoms contained in the solder 17, so that partial solder 17 is transformed into IMC layers 171, 172. More specifically, the IMC layers 171, 172 are respectively formed between the solder 17 and the electrical pads 13, 14. In this case, the formed IMC layers 171, 172 may cause the reliability of the flip-chip solder joint structure reduced.

Currently, in order to improve the property of the solder joints, one means is to reduce the thickness of the IMC layer. For example, a barrier layer is disposed between the electrical pad and the solder to prevent the growth of the IMC layer, as shown in U.S. Pat. No. 6,867,503 B2. However, the barrier layer causes the manufacturing cost of the electronic device increased, and the reliability thereof may be reduced.

Therefore, it is desirable to provide a novel electric connecting structure, in order to improve the property of solder joints and reduce the manufacturing cost thereof,

SUMMARY OF THE INVENTION

The present invention provides a method for fabricating an electric connecting structure comprising preferred oriented $Cu_6Sn_5$ grains, which comprises the following steps: (A) providing a first substrate; (B) forming a first nano-twinned copper layer on a part of a surface of the first substrate; (C) using a solder to connect the first substrate with a second substrate having a second electrical pad, in which the second electrical pad comprises a second nano-twinned copper layer, and the solder locates between the first nano-twinned copper layer and the second nano-twinned copper layer; and (D) performing a reflow process between 200° C. and 300° C. to transform at least part of the solder into an intermetallic compound (IMC) layer, in which the IMC layer comprises plural $Cu_6Sn_5$ grains with a preferred orientation, wherein at least 50% in volume of the first nano-twinned copper layer and the second nano-twinned copper layer respectively comprises plural crystal grains.

In the present invention, the reflow process has to be performed at a sufficient temperature, so the solder can be present in a liquid state to transform into the $Cu_6Sn_5$ grains. When the temperature for the reflow process is less than 200° C., a thicker $Cu_3Sn$ layer may be formed, in which the thickness of the $Cu_3Sn$ layer is more than half of the height of the $Cu_6Sn_5$ grains. The thickness of the $Cu_3Sn$ layer may be increased as the obtained electric connecting structure is stored for a long time. In this case, the $Cu_6Sn_5$ grains may disappear.

In the present invention, the reflow process is performed between 200° C. and 300° C. In this case, when the obtained electric connecting structure is used in normal condition, for example, the electric connecting structure is used at 100° C., the increase rate on the thickness of the $Cu_3Sn$ layer is relative slower than the growth rate of the $Cu_6Sn_5$ grains, and the size of the $Cu_6Sn_5$ grains is also increased. Hence, the control over the reflow temperature is quiet important.

In the method for fabricating the electric connecting structure of the present invention, the growth direction of the $Cu_6Sn_5$ grains can be well controlled. Hence, the property of microbumps formed by the $Cu_6Sn_5$ grains is closed to each other, and preferably identical to each other. Therefore, uniform electrical property among every joint can be obtained, so the electrical performance of the whole electric connecting structure can be further improved.

In the method for fabricating the electric connecting structure of the present invention, the problem that the conventional solder joints may happen due to the difference crystal orientation of Sn grains can be solved by controlling the growth direction of the $Cu_6Sn_5$ grains. When the electric connecting structure of the present invention is applied to flip-chip solder joint structure and three-dimensional integrated circuit (3D-IC) packaging and through silica via (TSV), the property of the solder joints can be ensured. In addition, the method for fabricating the electric connecting structure of the present invention can not only control the mechanical property, the electrical property, the reliability and the lifetime of the joints, but also reduce the manufacturing cost, because that there are no additional barrier materials or high-temperature heating treatment used in the method of the present invention.

In the method for fabricating the electric connecting structure of the present invention, the growth direction of the $Cu_6Sn_5$ grains is substantially perpendicular to a surface of the first nano-twinned copper layer.

In the method for fabricating the electric connecting structure of the present invention, an angle included between adjacent $Cu_6Sn_5$ grains is 0° to 40° in preferably at least 50% in volume of the $Cu_6Sn_5$ grains, more preferably at least 70% in volume thereof, and most preferably at least 90% in volume thereof. More specifically, in 50% and more in volume of the $Cu_6Sn_5$ grains, an angle included between the crystal axes of two adjacent $Cu_6Sn_5$ grains is 0° to 40°.

Furthermore, in the method for fabricating the electric connecting structure of the present invention, an angle included between a [0001] crystal axis of the $Cu_6Sn_5$ grains and a [111] orientation direction of the nano-twinned copper layer is 0° to 40° preferably in at least 50% in volume of the $Cu_6Sn_5$ grains, more preferably in at least 70% in volume thereof, and most preferably in at least 90% in volume thereof.

In the step (D) of the method for fabricating the electric connecting structure of the present invention, the reflow process preferably is performed for 30 sec to 10 min. The size and the height of the $Cu_6Sn_5$ grains are increased as the reflow time is prolonged.

In the step (D) of the method for fabricating the electric connecting structure of the present invention, the reflow temperature preferably is 240° C. to 280° C., and more preferably 260° C.

In the method for fabricating the electric connecting structure of the present invention, a $Cu_3Sn$ layer may be further comprised between the plural $Cu_6Sn_5$ grains and the first nano-twinned copper layer, and a ratio between a thickness of the $Cu_3Sn$ layer and a maximum height of the $Cu_6Sn_5$ grains is represented by: [thickness of the $Cu_3Sn$ layer]/[maximum height of the $Cu_6Sn_5$ grains], which preferably is 0 to 0.5 and more preferably $1\times10^{-4}$ to 0.3. As the storing time of the electric connecting structure is increased, the thickness of the $Cu_3Sn$ layer is also extended.

Hence, [thickness of the $Cu_3Sn$ layer]/[maximum height of the $Cu_6Sn_5$ grains] is preferably about 0 to 0.5, and more preferably about $1\times10^{-4}$ to 0.3.

Furthermore, a layer formed by the $Cu_6Sn_5$ grains preferably has a thickness of 500 nm to 10 μm; and the thickness of the $Cu_3Sn$ layer preferably is 1 nm to 1000 nm.

In the method for fabricating the electric connecting structure of the present invention, the crystal grains are preferably columnar twinned grain. In addition, each crystal grain preferably is formed as a result of the plurality of nano-twinned copper working to stack in a stacking direction of a [111] crystal axis, and an angle included between the stacking directions (i.e. the orientation direction) of adjacent crystal grains is 0° to 20°.

In the method for fabricating the electric connecting structure of the present invention, the first nano-twinned copper layer used in the step (B) can be prepared through direct current electroplating, pulsed electroplating, physical vapor deposition, chemical vapor deposition, or etching copper foil.

When the first nano-twinned copper layer is prepared through an electroplating process, a plating solution used in the step (B) can comprise: a copper-based salt, an acid and a chloride anion source. In addition, the plating solution may preferably further comprise at least one selected from a group consisting of gelatin, surfactant, and lattice dressing agent. Furthermore, the acid contained in the plating solution preferably is sulfuric acid, methyl sulfonate, or a combination thereof.

In the method for fabricating the electric connecting structure of the present invention, the first substrate preferably comprises a first electrical pad, in which the first electrical pad comprises the first nano-twinned copper layer or the first nano-twinned copper layer is used as the first electrical pad.

Furthermore, in the method for fabricating the electric connecting structure of the present invention, the second electrical pad of the second substrate preferably comprises a second nano-twinned copper layer, or the second nano-twinned copper layer is used as the second electrical pad.

In the method for fabricating the electric connecting structure of the present invention, the solder material may be selected from the group consisting of eutectic Sn/Pb solder, Sn/Ag/Cu solder, Sn/Ag solder and Pb-free solder.

In the method for fabricating the electric connecting structure of the present invention, the thickness the first and/or second nano-twinned copper layer is preferably 0.1 μm-500 μm, more preferably 0.1 μm-100 μm, and most preferably 0.1 μm-20 μm.

The present invention further provides an electric connecting structure comprising preferred oriented $Cu_6Sn_5$ grains, which comprises: a first substrate with a first electrical pad formed thereon, wherein the first electrical pad comprises a first nano-twinned copper layer; a second substrate with a second electrical pad formed thereon, wherein the second electrical pad comprises a second nano-twinned copper layer; and at least one IMC layer disposed between surfaces of the first nano-twinned copper layer and the second nano-twinned copper layer, wherein the IMC layer is disposed between the first substrate and the second substrate and electrically connects the first electrical pad and the second electrical pad, and the IMC layer comprises plural $Cu_6Sn_5$ grains with a preferred orientation, wherein at least 50% in volume of the first nano-twinned copper layer and the second nano-twinned copper layer respectively comprises plural crystal grains.

In the electric connecting structure of the present invention, the growth direction of the $Cu_6Sn_5$ grains is well controlled to obtain preferred oriented $Cu_6Sn_5$ grains. Hence, the problem that the conventional solder joints may be broken due to the difference crystal orientation of Sn grains can be solved. When the electric connecting structure of the present invention is applied to 3D-IC packaging and through silica via (TSV), the property of the solder joints can be ensured. More specifically, since the growth direction of the $Cu_6Sn_5$ grains is well controlled, the property of microbumps formed by the $Cu_6Sn_5$ grains is closed to each other, and preferably identical to each other. Therefore, the electrical and mechanical property differences in the electric connecting structure can be eliminated, so the electrical performance and reliability thereof can further be improved.

In addition, the mechanical property, the electrical property, the reliability and the lifetime of the joints in the electric connecting structure of the present invention can be controlled, and the manufacturing cost thereof can also be reduced, since there are no additional barrier materials or high-temperature heating treatment used in the present invention.

In the electric connecting structure of the present invention, an angle included between adjacent $Cu_6Sn_5$ grains is 0° to 40° in preferably at least 50% in volume of the $Cu_6Sn_5$ grains, more preferably at least 70% in volume thereof, and most preferably at least 90% in volume thereof. More specifically, in 50% and more in volume of the $Cu_6Sn_5$ grains, an angle included between the crystal axes of two adjacent $Cu_6Sn_5$ grains is 0° to 40°.

In addition, in the electric connecting structure of the present invention, an angle included between a [0001] crystal axis of the $Cu_6Sn_5$ grains and a [111] orientation direction of the nano-twinned copper layer is 0° to 40° preferably in at least 50% in volume of the $Cu_6Sn_5$ grains, more preferably in at least 70% in volume thereof, and most preferably in at least 90% in volume thereof. In the electric connecting structure of the present invention, a $Cu_3Sn$ layer may be further comprised between the plural $Cu_6Sn_5$ grains and the first nano-twinned copper layer, and a ratio between a thickness of the $Cu_3Sn$ layer and a maximum height of the $Cu_6Sn_5$ grains is represented by: [thickness of the $Cu_3Sn$ layer]/[maximum height of the $Cu_6Sn_5$ grains], which preferably is 0 to 0.5 and more preferably $1\times10^{-4}$ to 0.3.

Furthermore, a layer formed by the $Cu_6Sn_5$ grains preferably has a thickness of 500 nm to 10 μm; and the thickness of the $Cu_3Sn$ layer preferably is 1 nm to 1000 nm.

In the electric connecting structure of the present invention, the crystal grains preferably connect to each other, each crystal grain preferably is formed as a result of the plurality of nano-twinned copper working to stack in a stacking direction of a [111] crystal axis, and an angle included between the stacking directions of adjacent crystal grains is 0° to 20°.

In the electric connecting structure of the present invention, the first substrate preferably comprises a first electrical pad, which comprises the first nano-twinned copper layer.

In the electric connecting structure of the present invention, the second electrical pad of the second substrate preferably comprises a second nano-twinned copper layer.

In the electric connecting structure of the present invention, the thickness of the first nano-twinned copper layer and the second nano-twinned copper layer preferably is 0.1 μm-500 μm, respectively.

In addition, in the electric connecting structure of the present invention, the first substrate and/or the second substrate is respectively selected from the group consisting of a semiconductor chip, a circuit board, and a conductive substrate, preferably.

The electric connecting structure of the present invention may further comprise a solder layer disposed between the first substrate and the second substrate, and more specifically between the first nano-twinned copper layer and the second electrical pad. The solder layer is a redundant layer that partial solder is not transferred into the IMC layer during the reflow process. The material of the solder layer is preferably selected from the group consisting of: eutectic Sn/Pb solder, Sn/Ag/Cu solder, Sn/Ag solder, Sn/Cu solder and other Pb-free solder.

In addition, the electric connecting structure of the present invention may further comprise a seed layer disposed between the first nano-twinned copper layer and an adhesion layer of the semiconductor chip.

The electric connecting structure of the present invention may further comprise an adhesion layer disposed between the seed layer and the semiconductor chip such as a silica wafer. The material of the adhesion layer is selected from the group consisting of Ti, TiW, TiN, TaN, Ta, and an alloy thereof.

the present invention, the diameter of the crystal grains can be 0.1 μm-50 μm. In addition, the thickness (or the height) of the crystal grains is preferably 0.01 μ-1000 μm, more preferably 0.01 μ-200 μm, and most preferably 0.01 μ-100 μm.

Other objects, advantages, and novel features of the invention will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

[Embodiment]1

Figure 1:
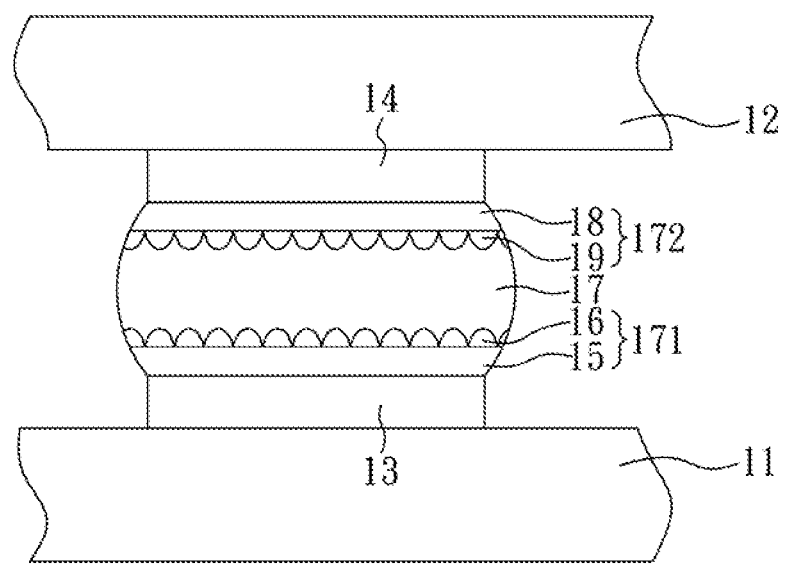
FIG. 1 is a perspective view showing a conventional flip-chip solder joint structure.
Figure 2A:
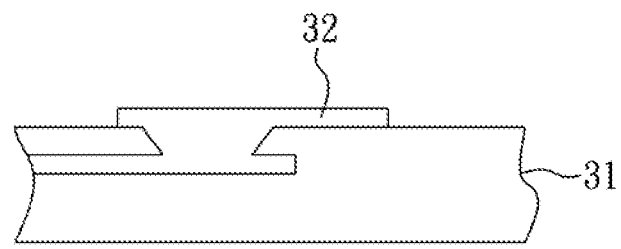
FIGS. 2A to 2D show a process for fabricating an electric connecting structure according to Embodiment 1 of the present invention.
Figure 2B:
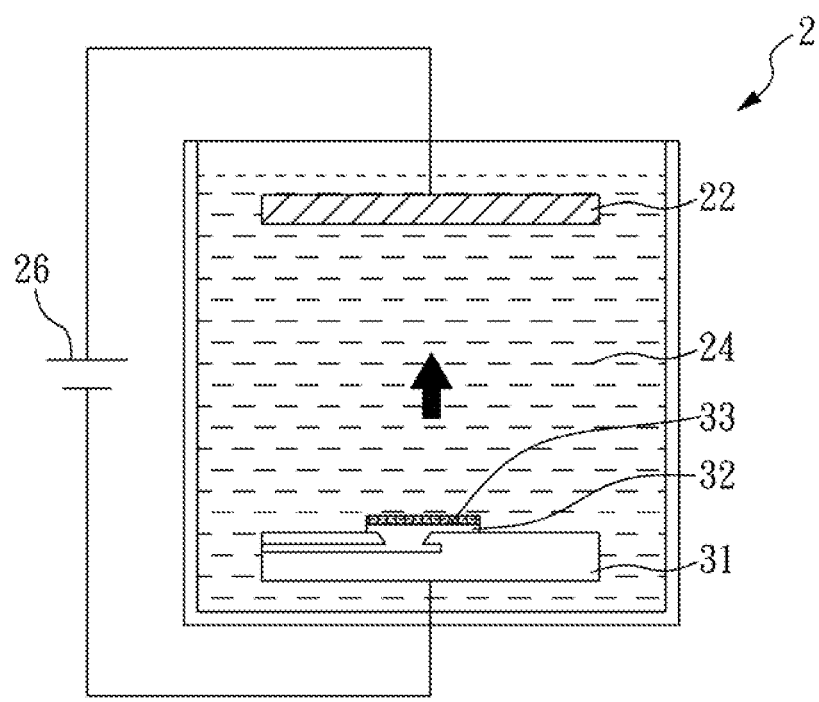

FIGS. 2A to 2D show a process for fabricating an electric connecting structure according to Embodiment 1 of the present invention. As shown in FIG. 2A, a substrate 31 is provided. In the present embodiment, the substrate 31 is a circuit board with a circuit layer 32 (which can also be used as an electrical pad). Next, as shown in FIG. 2B, the substrate 31 is placed into an electroplating device 2 to use as a cathode. The electroplating device 2 comprises an anode 22, which is immersed in an electroplating solution 24 and electrically connects to a direct current power supply source 26 (Keithley 2400 is used herein). The material used in anode 22 can be copper, phosphor bronze or inert anode material such as platinum plating titanium. The electroplating solution 24 comprises copper sulfate (copper ion concentration being 20-60 g/L), chlorine ion (concentration being 10-100 ppm), and methyl sulfonate (concentration being 80-120 g/L), and other surfactants or lattice dresser (e.g. BASF Lugalvan 1-100 ml/L) can also be added thereto. In addition, the electroplating solution 24 used in the present embodiment may further comprise an organic acid (e.g. methyl sulfonate), gelatin, or a combination thereof for adjusting crystal grain structure and size.

Next, a direct current power is supplied in 2-10 ASD current densities to perform the electroplating process, and nano-twinned copper grows on a surface of the circuit layer 32 in a direction pointed by an arrow, as shown in FIG. 2B. During the electroplating process, the (111) plane of the nano-twinned copper and the surface of the nano-twinned copper layer is approximately perpendicular to the direction of the electric field, and the twinned copper is grown at a speed of about 1.76 μm/min. After the electroplating process, the obtained first nano-twinned copper layer 33 used as the electrical pad comprises plural crystal grains, which is composed of plural nano-twinned copper. The crystal grains extend to the surface of the first nano-twinned copper layer 33, so the exposed surface of the first nano-twinned copper layer 33 is also in a (111) plane. In the present embodiment, the obtained first nano-twinned copper layer 33 has a thickness of 20 μm, and the [111] crystal axis thereof is an axis normal to the (111) plane.

Figure 2C:
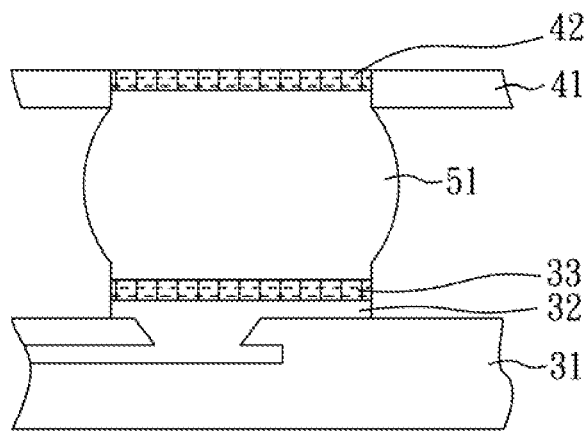

As shown in FIG. 2C, a semiconductor chip 41 is provided, which has an electrical pad 42 made of a nano-twinned copper layer, i.e. a second nano-twinned copper layer. The second nano-twinned copper layer is prepared by the same method for fabricating the first nano-twinned copper layer 33. Next, a solder 51 provided to connect the electrical pad 42 of the semiconductor chip 41 and the first nano-twinned copper layer 33 of the substrate 31.

Figure 2D:
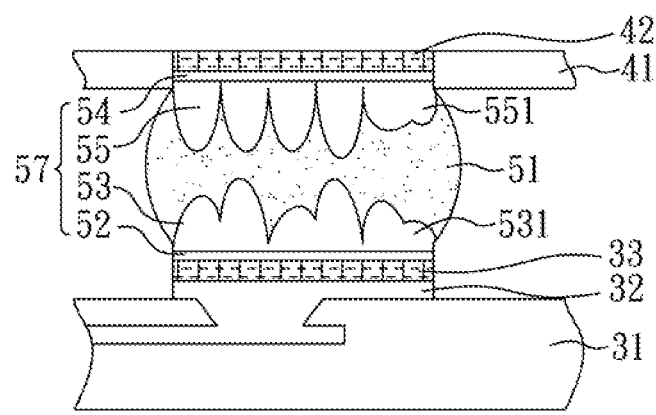

Then, a reflow process is performed, wherein the reflow temperature is 260° C., and the reflow time is 30 sec and more (for example, 1 mm, 3 min or 5 min). The reflow time can be adjusted based on the amount of the solder. In the present embodiment, the reflow time is 5 min. As shown in FIG. 2D, after the reflow process, parts of the solder 51 is transformed into an IMC layer 57, which comprises a $Cu_3Sn$ layer 54 and a $Cu_6Sn_5$ layer 55. The $Cu_6Sn_5$ layer 55 comprises plural oriented $Cu_6Sn_5$ grains 551, which extend from a surface of the $Cu_3Sn$ layer 54. The reflow process has to be performed at a sufficient temperature, so the solder can be present in a liquid state to grow the $Cu_6Sn_5$ grains. Hence, the reflow temperature is preferably a temperature which can make the solder melt. For example, the reflow temperature is about 230° C. or more. It should be noted that the electrical element may be damaged when the reflow temperature is too high, so the reflow temperature has to be controlled.

Figure 3A:
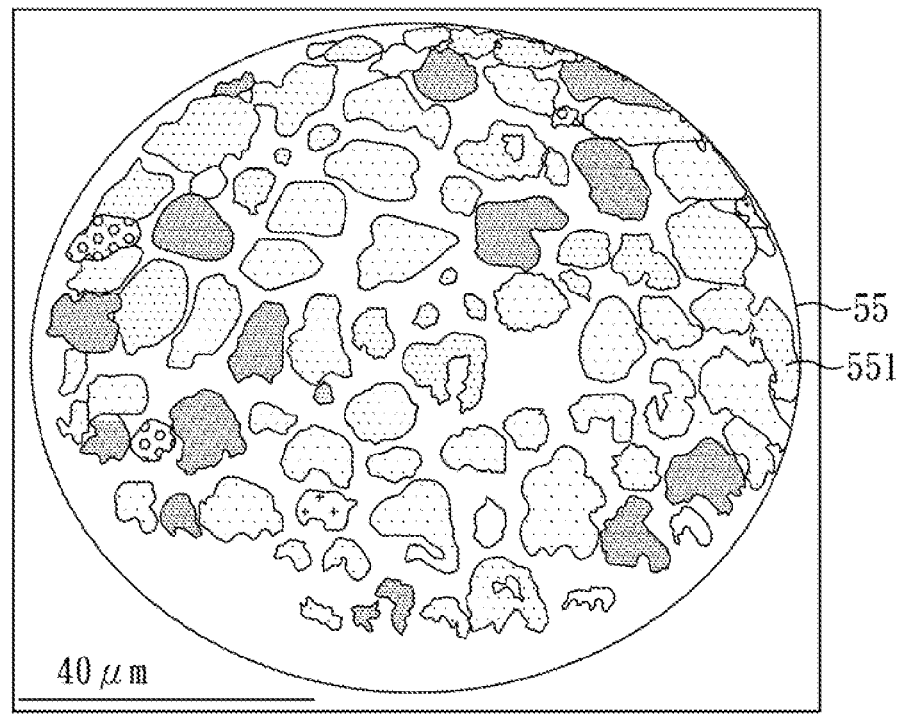
FIG. 3A is a perspective view showing an Electron Back-Scattered Diffraction (EBSD) orientation image in a plan-view for a $Cu_6Sn_5$ layer according to Embodiment 1 of the present invention.
Figure 3B:
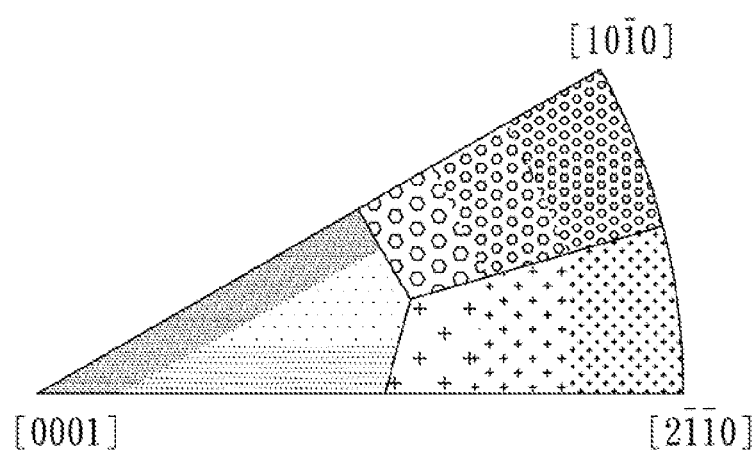
FIG. 3B shows a reference for the EBSE orientation image of FIG. 3A.

FIG. 3A is a perspective view showing an Electron Back-Scattered Diffraction (EBSD) orientation image in a plane-view for a $Cu_6Sn_5$ layer 55 with plural $Cu_6Sn_5$ grains 551 of the present embodiment; and FIG. 3B shows a reference for the EBSD orientation image of FIG. 3A. According to the reference shown in FIG. 3B, it can be known that the $Cu_6Sn_5$ grains 551 shown in dots are grown in a direction close to [0001] direction; the $Cu_6Sn_5$ grains 551 shown in crosses are grown in a direction close to [2110] direction, and the $Cu_6Sn_5$ grains 551 shown in circles are grown in a direction close to [1010]. As shown in FIG. 3A, most of the $Cu_6Sn_5$ grains 551 are grown in a direction close to [0001] direction, which is represented in dots. This result shows that the growth direction of the $Cu_6Sn_5$ grains can be well controlled in the present embodiment.

In the present embodiment, the growth direction of the $Cu_6Sn_5$ grains is controlled, so the problem that the conventional solder joints may be broken due to the difference crystal orientation of Sn grains can be solved. When the electric connecting structure of the present embodiment is applied to 3D-IC packaging and through silica via (TSV), the property of the solder joints can be ensured. In addition, the mechanical property, the electrical property, the reliability and the lifetime of the joints can be controlled and the manufacturing cost thereof can further be reduced in the present embodiment, because there are no additional barrier materials or high-temperature heating treatment used in the method of the present embodiment.

Figure 4:
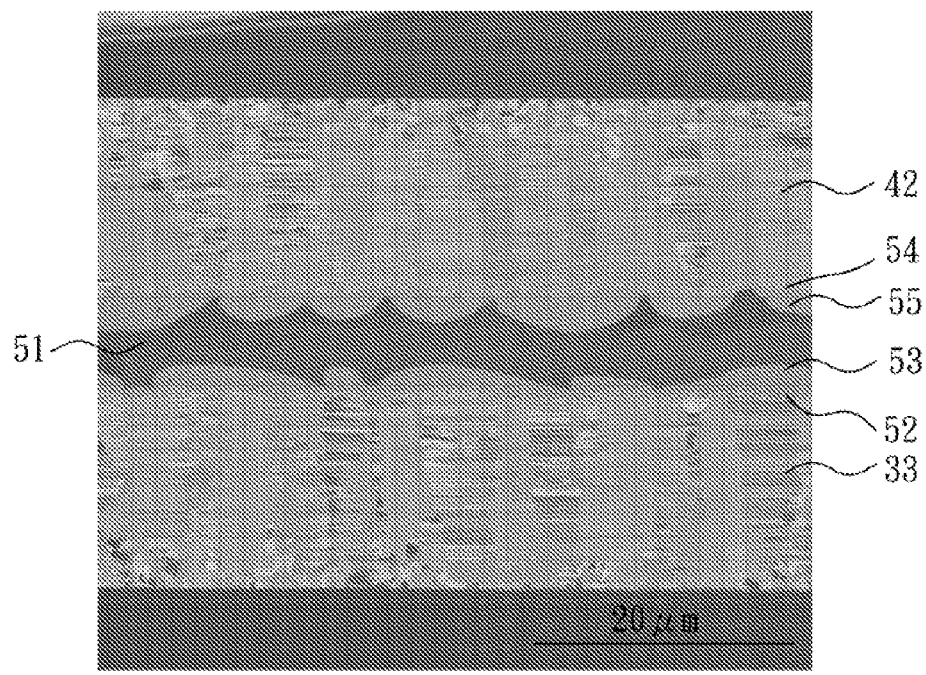
FIG. 4 is a cross-sectional focused ion beam (FIB) image of an electric connecting structure according to Embodiment 1 of the present invention.

FIG. 4 is a cross-sectional focused ion beam (FIB) image of an electric connecting structure of the present embodiment. As shown in FIG. 2D and FIG. 4, the electric connecting structure comprising preferred oriented $Cu_6Sn_5$ grains of the present embodiment comprises: a substrate 31 with a circuit layer 32 formed thereon, in which a surface of the circuit layer 32 has a first nano-twinned copper layer 33 as an electrical pad; a semiconductor chip 41 with an electrical pad 42 formed by a nano-twinned copper layer; and at least one IMC layer 57 formed on a surface of the first nano-twinned copper layer 33, wherein the IMC layer 57 is disposed between the substrate 31 and the semiconductor chip 41, and the IMC layer 57 comprises $Cu_3Sn$ layers 54, 52 and $Cu_6Sn_5$ layers 53, 55. Each $Cu_6Sn_5$ layer 53, 55 comprises plural oriented $Cu_6Sn_5$ grains 551, 531, and at least 50% in volume of the first nano-twinned copper layer 33 comprises plural crystal grains. In the present embodiment, the thickness of the $Cu_6Sn_5$ layer 55 is about 1 μm-5 μm, and that of $Cu_3Sn$ layer 54 is about 10 nm-50 nm.

The structure of the first nano-twinned copper layer 33 is described after all the embodiments.

[Embodiment]2

Figure 5:
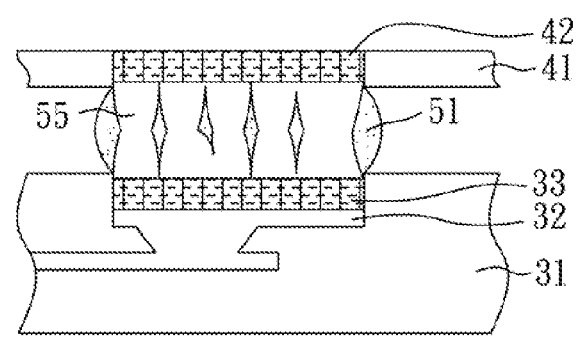
FIG. 5 is a perspective view showing an electric connecting structure according to Embodiment 2 of the present invention.

FIG. 5 is a perspective view showing an electric connecting structure of the present embodiment. The structure and the fabricating method of the electric connecting structure of the present embodiment is similar to that of Embodiment 1, except that the reflow time used in the present embodiment is longer than that used in Embodiment. The reflow time is about 5-6 min, so the size of the $Cu_6Sn_5$ grains 551, 531 is increased and the thickness of the $Cu_6Sn_5$ layer 55 is increased to about 10 μm-30 μm. In the present embodiment, the thickness of the solder 51 and the reflow time performed thereon are adjusted, so the $Cu_6Sn_5$ grains 551, 531 on the surfaces of the substrate 31 and the semiconductor 41 can be adhered to each other. In addition, the inventor confirmed that the $Cu_6Sn_5$ grains are still well oriented, even though the $Cu_6Sn_5$ grains 551, 531 are adhered to each other. The aforementioned result indicates that the method of the present invention can control the growth direction of the $Cu_6Sn_5$ grains.

When the $Cu_6Sn_5$ grains 551, 531 on the upper and lower substrate are adhered to each other, it means that almost all the solder 51 is transformed in to the IMC layer, or only a little part of the solder 51 is present between the $Cu_6Sn_5$ grains 551, 531. In the case that the $Cu_6Sn_5$ grains 551, 531 on the upper and lower substrate are adhered to each other, the mechanical property, the electrical property, the reliability and the lifetime of the joints can be controlled can be controlled. Hence, the reduced reliability caused by the weak joints can be prevented, and the lifetime of electronic devices can further be improved.

Figure 6A:
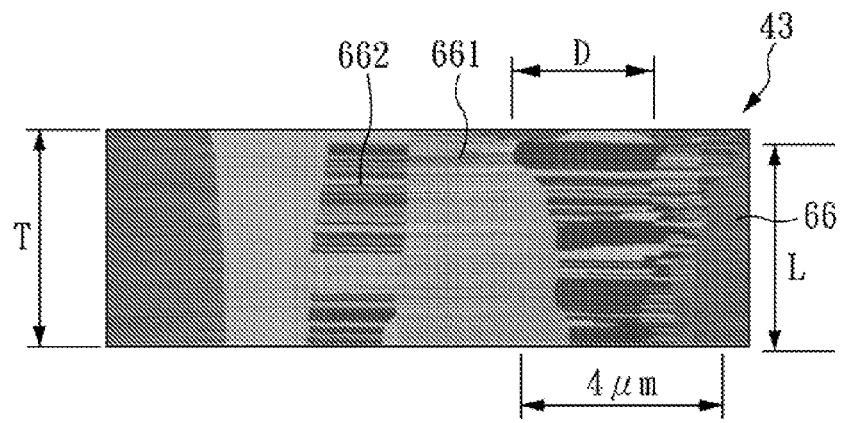
FIG. 6A is a cross-sectional FIB image of a nano-twinned copper layer according to one preferred embodiment of the present invention.
Figure 6B:
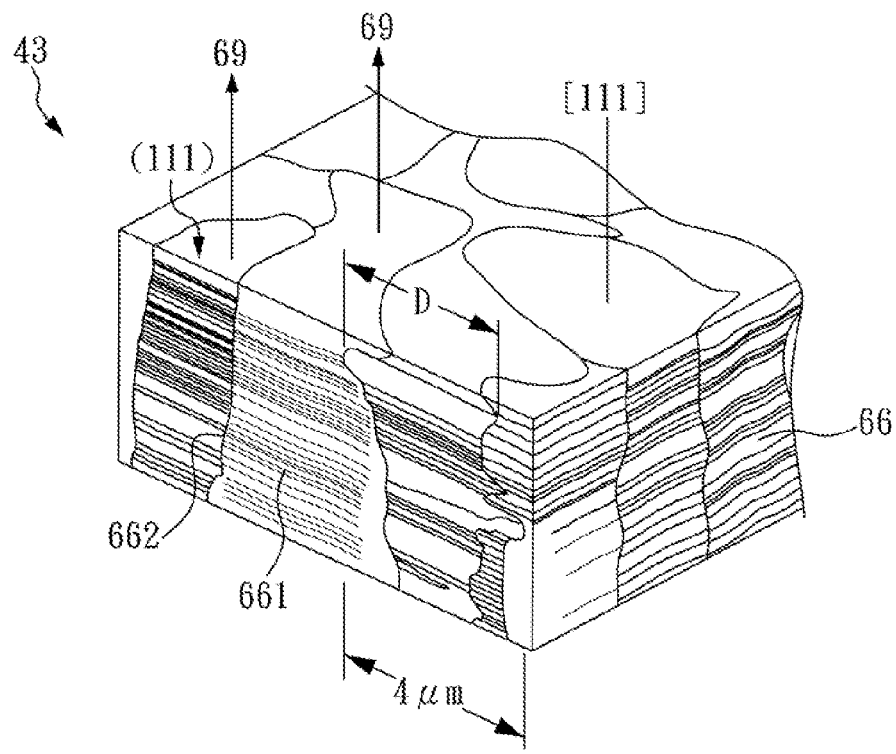
FIG. 6B is a perspective view showing a nano-twinned copper layer according to one preferred embodiment of the present invention.

FIGS. 6A and 6B are respectively a cross-sectional FIB image and a perspective view of a nano-twinned copper layer of the present embodiment. As shown in FIGS. 6A and 6B, at least 50% in volume of the nano-twinned copper layer 43 comprises plural columnar crystal grains 66, and each crystal grain comprises plural layered nano-twinned copper. For example, neighboring sets of black lines and white lines constitute a nano-twinned copper, and the nano-twinned coppers stack in a stacking direction 69 to form a crystal grain 66. Hence, the whole nano-twinned copper layer comprises plenty of nano-twinned copper. The diameter D of these columnar crystal grains 55 is in a range of 0.5 μm to 8 μm. The height L thereof is about 1 μm-500 μm, preferably 1 μm-100 μm, and more preferably 1 μm-20 μm. The surface 661 of the nano-twinned copper indicated in horizontal lines is parallel to the (111) plane. A boundary 662 is present between nano-twinned coppers. The (111) plane of the copper is perpendicular to the direction showing the thickness T. In addition, the thickness T of the nano-twinned copper layer is about 20 μm, which may be adjusted between 0.1 μm to 500 μm if it is necessary. Furthermore, an angel included between the stacking directions of adjacent crystal grains is about 0° to 20°, in which the stacking direction is almost the same as the [111] crystal axis.

In conclusion, according to the electric connecting structure and the method for fabricating the same of the present invention, the growth direction of the $Cu_6Sn_5$ grains can be controlled. Hence, the problem that the reliability may be reduced due to the IMC layers contained in the solder joints can be solved, and the property of the solder joints can be controlled. In addition, the mechanical property, the electrical property, the reliability and the lifetime of the joints of the electric connecting structure of the present invention can be controlled by using the method for fabricating the same of the present invention. Furthermore, no additional barrier materials and high-temperature heating treatments are used in the method of the present invention, so the manufacturing cost of the electric connecting structure can further be reduced.

Although the present invention has been explained in relation to its preferred embodiment, it is to be understood that many other possible modifications and variations can be made without departing from the spirit and scope of the invention as hereinafter claimed.

What is claimed is:

1. A method for fabricating an electric connecting structure comprising preferred oriented $Cu_6Sn_5$ grains, which comprises the following steps:
   (A) providing a first substrate;
   (B) forming a first nano-twinned copper layer on a part of a surface of the first substrate;
   (C) using a solder to connect the first substrate with a second substrate having a second electrical pad, in which the second electrical pad comprises a second nano-twinned copper layer, and the solder locates between the first nano-twinned copper layer and the second nano-twinned copper layer; and
   (D) performing a reflow process between 200° C. and 300° C. to transform at least part of the solder into an intermetallic compound (IMC) layer, in which the IMC layer comprises plural $Cu_6Sn_5$ grains with a preferred orientation,
   wherein at least 50% in volume of the first nano-twinned copper layer and the second nano-twinned copper layer respectively comprises plural crystal grains.

2. The method as claimed in, claim 1, wherein an angle included between adjacent $Cu_6Sn_5$ grains is 0° to 40° in at least 50% in volume of the $Cu_6Sn_5$ grains.

3. The method as claimed in claim 1, wherein an angle included between a [0001] crystal axis of at least 50% in volume of the $Cu_6Sn_5$ grains and a [111] orientation direction of the first nano-twinned copper layer is 0° to 40°, and an angle included between a [0001] crystal axis of at least 50% in volume of the $Cu_6Sn_5$ grains and a [111] orientation direction of the second nano-twinned copper layer is 0° to 40°.

4. The method as claimed in claim 1, wherein the reflow process is performed for 30 sec to 10 min in the step (D).

5. The method as claimed in claim 1, wherein the reflow process is performed at 240° C. to 280° C. in the step (D).

6. The method as claimed in claim 1, wherein a $Cu_3Sn$ layer is further comprised between the plural $Cu_6Sn_5$ grains and the first nano-twinned copper layer, and a ratio between a thickness of the $Cu_3Sn$ layer and a maximum height of the $Cu_6Sn_5$ grains is represented by: [thickness of the $Cu_3Sn$ layer]/[maximum height of the $Cu_6Sn_5$ grains], which is $1\times10^{-4}$ to 0.3.

7. The method as claimed in claim 1, wherein a layer formed by the $Cu_6Sn_5$ grains has a thickness of 500 nm to 10 μm.

8. The method as claimed in claim 6, wherein a thickness of the $Cu_3Sn$ layer is 1 nm to 1000 nm.

9. The method as claimed in claim 1, wherein the crystal grains connect to each other, each crystal grain is formed as a result of the plurality of nano-twinned copper working to stack in a stacking direction of a [111] crystal axis, and an angle included between the stacking directions of adjacent crystal grains is 0° to 20°.

10. The method as claimed in claim 1, wherein the first nano-twinned copper layer in the step (B) is prepared through direct current electroplating, pulsed electroplating, physical vapor deposition, chemical vapor deposition, or etching copper foil.

11. The method as claimed in claim 10, wherein a plating solution for forming the first nano-twinned copper layer comprises: a copper-based salt, an acid and a chloride anion source.

12. The method as claimed in claim 11, wherein the plating solution further comprises at least one selected from a group consisting of gelatin, surfactant, and lattice dressing agent.

13. The method as claimed in claim 1, wherein the acid contained in the plating solution is sulfuric acid, methyl sulfonate, or a combination thereof.

14. The method as claimed in claim 1, wherein the first substrate comprises a first electrical pad, which comprises the first nano-twinned copper layer.

15. The method as claimed in claim 1, wherein a thickness of the first nano-twinned copper layer is 0.1 μm-500 μm.

16. An electric connecting structure comprising preferred oriented $Cu_6Sn_5$ grains, comprising:
   a first substrate with a first electrical pad formed thereon, wherein the first electrical pad comprises a first nano-twinned copper layer;
   a second substrate with a second electrical pad formed thereon, wherein the second electrical pad comprises a second nano-twinned copper layer; and
   at least one IMC layer disposed between surfaces of the first nano-twinned copper layer and the second nano-twinned copper layer, wherein the IMC layer is disposed between the first substrate and the second substrate and electrically connects the first electrical pad and the second electrical pad, and the IMC layer comprises plural $Cu_6Sn_5$ grains with a preferred orientation,
   wherein at least 50% in volume of the first nano-twinned copper layer and the second nano-twinned copper layer respectively comprises plural crystal grains.

17. The electric connecting structure as claimed in claim 16, wherein an angle included between adjacent $Cu_6Sn_5$ grains is 0° to 40° in at least 50% in volume of the $Cu_6Sn_5$ grains.

18. The electric connecting structure as claimed in claim 16, wherein an angle included between a [0001] crystal axis of at least 50% in volume of the $Cu_6Sn_5$ grains and a [111] orientation direction of the first nano-twinned copper layer is 0° to 40°, and an angle included between a [0001] crystal axis of at least 50% in volume of the $Cu_6Sn_5$ grains and a [111] orientation direction of the second nano-twinned copper layer is 0° to 40°.

19. The electric connecting structure as claimed in claim 16, wherein a $Cu_3Sn$ layer is further comprised between the plural $Cu_6Sn_5$ grains and the first nano-twinned copper layer, and a ratio between a thickness of the $Cu_3Sn$ layer and a maximum height of the $Cu_6Sn_5$ grains is represented by: [thickness of the $Cu_3Sn$ layer]/[maximum height of the $Cu_6Sn_5$ grains], which is $1\times10^{-4}$ to 0.3.

20. The electric connecting structure as claimed in claim 16, wherein a layer formed by the $Cu_6Sn_5$ grains has a thickness of 500 nm to 10 μm.

21. The electric connecting structure as claimed in claim 19, wherein a thickness of the $Cu_3Sn$ layer is 1 nm to 1000 nm.

22. The electric connecting structure as claimed in claim 16, wherein the crystal grains connect to each other, each crystal grain is firmed as a result of the plurality of nano-twinned copper working to stack in a stacking direction of a [111] crystal axis, and an angle included between the stacking directions of adjacent crystal grains is 0° to 20°.

23. The electric connecting structure as claimed in claim 16, wherein thicknesses of the first nano-twinned copper layer and the second nano-twinned copper layer are 0.1 μm-500 μm, respectively.

24. The electric connecting structure as claimed in claim 16, wherein the first substrate and the second substrate are respectively a semiconductor chip, a circuit board, or a conductive substrate.

\* \* \* \* \*